United States Patent [19]

Weed et al.

[11] Patent Number: 5,153,100
[45] Date of Patent: Oct. 6, 1992

[54] BORATE COINITIATORS FOR PHOTOPOLYMERIZABLE COMPOSITIONS

[75] Inventors: Gregory C. Weed, Towanda, Pa.; Dietrich Fabricius, Hendersonville, N.C.

[73] Assignee: E. I. du Pont de Nemours and Company, Wilmington, Del.

[21] Appl. No.: 573,603

[22] Filed: Aug. 27, 1990

[51] Int. Cl.⁵ ............ G03F 7/032; G03F 7/029; G03F 7/031
[52] U.S. Cl. .................... 430/281; 430/914; 430/915; 430/916; 522/14; 522/15; 522/16; 522/25
[58] Field of Search ............ 430/281, 914, 915, 916; 522/14, 25, 16, 15

[56] References Cited

U.S. PATENT DOCUMENTS

| | | | |
|---|---|---|---|
| 4,343,891 | 8/1982 | Aasen et al. | 430/339 |
| 4,772,530 | 9/1988 | Gottschalk et al. | 522/25 |
| 4,772,541 | 9/1988 | Gottschalk et al. | 430/339 |
| 4,859,572 | 8/1989 | Farid et al. | 430/281 |
| 4,902,604 | 2/1990 | Yamaguchi et al. | 430/281 |
| 4,917,977 | 4/1990 | Smothers | 522/14 |
| 4,937,159 | 6/1990 | Gottschalk et al. | 430/138 |
| 4,950,581 | 8/1990 | Koike et al. | 430/281 |
| 4,952,480 | 8/1990 | Yamaguchi et al. | 430/281 |
| 4,954,414 | 9/1990 | Adair et al. | 430/281 |
| 4,971,892 | 11/1990 | Ali et al. | 522/14 |
| 5,055,372 | 10/1991 | Shanklin et al. | 430/281 |

FOREIGN PATENT DOCUMENTS 3822921 7/1988 Fed. Rep. of Germany.
1-13142 1/1989 Japan.

Primary Examiner—Marion E. Mc Camish
Assistant Examiner—C. D. RoDee

[57] ABSTRACT

Photopolymerizable compositions in which the photoinitiator system contains a hexaarylbisimidazole and/or a p-dialkyaminophenyl carbonyl compound in combination with a borate anion coinitiator are disclosed.

30 Claims, No Drawings

BORATE COINITIATORS FOR PHOTOPOLYMERIZABLE COMPOSITIONS

FIELD OF THE INVENTION

This invention relates to initiator systems for photopolymerizable compositions. More particularly, this invention pertains to photopolymerizable compositions in which the photoinitiator system contains a hexaarylbisimidazole and/or a p-dialkyaminophenyl carbonyl compound in combination with a borate anion coinitiator.

BACKGROUND OF THE INVENTION

The use of photoinitiator systems to initiate photopolymerization is well known. When irradiated by actinic radiation, the photoinitiator system generates free radicals which initiate polymerization of the monomer or monomers. The photoinitiator system may be a single compound which absorbs actinic radiation and forms the initiating radicals or it may consist of several different materials which undergo a complex series of reactions to produce radicals. Added components, which do not absorb actinic radiation, but which increase the efficiency of the photoinitiator system, are known as coinitiators.

Borate anion coinitiators have recently been disclosed. Gottschalk et al., U.S. Pat. Nos. 4,772,530 and 4,772,541, disclose photopolymerizable compositions containing a cationic dye-borate anion complex in which the cationic dye-borate anion complex is capable of absorbing actinic radiation and producing free radicals. Cationic methine, polymethine, triarylmethane, indoline, thiazine, xanthene, oxazine, and acridine were disclosed. Triaryl alkyl borate anions were the preferred borate coinitiators.

Yamaguchi et al., U.S. Pat. No. 4,902,604, discloses photopolymerizable compositions containing a salt formed by an organic cationic dye compound and a borate anion. In these salts the cationic dye compound comprised an azulene ring having a nitrogen atom or a chalcogen atom in the 2- or 4-position.

Koike et al., Federal Republic of Germany patent application 3,822,921 equivalent to U.S. Pat. No. 4,950,581, discloses photopolymerizable compositions containing an organic dye and a triaryl butyl borate anion coinitiator. In these systems the dye did not contain a counter anion. Merocyanine type dyes, coumarin type dyes, and xanthene and thioxanthene dyes were disclosed.

Despite the many improvements made in photoinitiator systems, a need exists for photopolymerizable compositions with increased photospeed. With increased photospeed, shorter irradiation times are possible. The time and effort necessary to prepare an image is reduced, and the capacity of existing equipment is increased. Since exposure times are reduced, increased photospeed frequently leads to improved image quality as well.

SUMMARY OF THE INVENTION

The invention is a photopolymerizable composition with improved sensitivity to actinic radiation. In one embodiment this invention is a photopolymerizable composition comprising:

(A) an ethylenically unsaturated monomer capable of free-radical initiated polymerization; and (B) an initiator system activatible by actinic radiation, said initiator system consisting essentially of:
(1) at least one compound selected from the group consisting of
(a) hexaarylbisimidazole and
(b) p-aminophenyl carbonyl compound of the following structure:

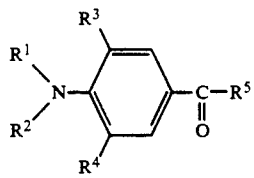

where:
$R^1$ and $R^2$ are each independently hydrogen or alkyl from one to six carbon atoms and $R^3$ and $R^4$ are hydrogen, or $R^1 + R^3$ are $-(CH_2)_2-$ or $-(CH_2)_3-$ and $R^2 + R^4$ are $-(CH_2)_3-$;
$R^5$ is hydrogen, alkyl of one to six carbon atoms, unsubstituted or substituted phenyl, or $-OR^6$, where $R^6$ is alkyl of one to six carbon atoms or unsubstituted or substituted phenyl;

(2) a borate salt containing a cation which does not absorb a significant amount of actinic radiation and an anion represented by the formula:

$$BX_1X_2X_3X_4^-$$

wherein $X_1$, $X_2$, $X_3$, and $X_4$, the same or different, are selected from the group consisting of alkyl, aryl, aralkyl, alkenyl, alkynyl, alicyclic, heterocyclic, and allyl groups, with the proviso that at least one of $X_1$, $X_2$, $X_3$, and $X_4$ is not aryl.

Preferred hexaarylbisimidazoles are 2-o-chlorophenyl-substituted derivatives in which the other positions of the phenyl radicals are either unsubstituted or substituted with chloro, methyl or methoxy groups. The most preferred p-aminophenyl carbonyl compounds are Michler's ketone, ethyl Michler's ketone, bis-(9-julolidyl)ketone, methyl p-dimethyaminobenzoate and ethyl p-dimethyaminobenzoate. Preferred borate anion coinitiators are triaryl alkyl borate anions. In a preferred embodiment the photopolymerizable composition also comprises a binder.

DETAILED DESCRIPTION OF THE INVENTION

The novel compositions of this invention are photopolymerizable compositions in which polymerization is initiated by free radicals generated by actinic radiation. Photopolymerization proceeds by free radical initiated addition polymerization and/or crosslinking of ethylenically unsaturated monomeric compounds. These compositions comprise a photoinitiator system, at least one polymerizable monomer, and, in the preferred case at least one binder. The photoinitiator system consists essentially of (a) hexaarylbisimidazole and/or a p-aminophenyl carbonyl compound and (b) a borate anion coinitiator. These compositions may also comprise other ingredients, such as plasticizers, stabilizers, adhesion promoters, coating aids, and the like.

Photoinitiator System

The photoinitiator system generates the free radicals which initiate polymerization of the monomer or monomers. The photoinitiator system should have a high molar absorption coefficient in the desired absorption range and should have a generate radicals with high efficiency. In addition, the system should possess such other desirable properties such as dark stability, shelf-life, absence of odor, low toxicity, and reasonable cost.

Photoinitiator systems containing p-aminophenyl carbonyl compounds are well known. p-Aminophenyl carbonyl compounds require a coinitiator to efficiently initiate polymerization. Typical coinitiators are hydrogen abstracting ketones such as benzophenone or camphorquinone (2,3-boranedione). Photoinitiator systems which contain Michler's ketone (4,4'-bis-(dimethylamino)benzophenone) in combination with a hydrogen abstractor are disclosed in Chang, U.S. Pat. No. 3,756,827 and in G. S. Hammond, et al., *J. Am. Chem. Soc.*, 92, 6362 (1970). Photoinitiator systems which contain p-dimethylaminobenzaldehyde or an ester of p-dimethylaminobenzoic acid in combination with a hydrogen abstractor are disclosed in Barzynski, et al., U.S. Pat. No. 4,113,593.

It has been discovered that borate anions may be used as coinitiators with p-aminophenyl carbonyl compounds. The borate anion may be used in place of the hydrogen abstracting ketone. Alternatively the borate anion may be added to a p-aminophenyl carbonyl compounds - hydrogen abstracting ketone initiator system to produce an initiator system with increased speed. A preferred hydrogen abstracting ketone is benzophenone.

p-Aminophenyl carbonyl compounds of the following structure may be used:

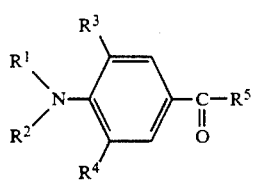

where:

$R^1$ and $R^2$ are each independently hydrogen or alkyl from one to six carbon atoms and $R^3$ and $R^4$ are hydrogen, or $R^1+R^3$ are —$(CH_2)_2$— or —$(CH_2)_3$—, or $R^2+R^4$ are —$(CH_2)_3$—; $R^5$ is hydrogen, alkyl from one to six carbon atoms, unsubstituted or substituted phenyl, or —$OR^6$, where $R^6$ is alkyl of one to six carbon atoms or unsubstituted or substituted phenyl.

In a preferred class of p-aminophenyl carbonyl compounds $R^1$ and $R^2$ are each independently alkyl from one to three carbon atoms and $R^3$ and $R^4$ are hydrogen, or $R^1+R^3$ and $R^2+R^4$ are independently —$(CH_2)_3$—; $R^5$ is (1) hydrogen, (2) alkyl from one to four carbon atoms, (3) —$OR^6$, where $R^6$ is alkyl of one to four carbon atoms or unsubstituted or substituted phenyl, or (4):

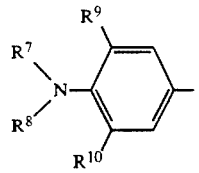

where $R^7$ and $R^8$ are each independently alkyl from one to three carbon atoms and $R^9$ and $R^{10}$ are hydrogen, or $R^7+R^9$ and $R^8+R^{10}$ are independently —$(CH_2)_3$—.

In a more preferred class of p-aminophenyl carbonyl compounds $R^1$, $R^2$, $R^7$, and $R^8$ are the same and equal to alkyl from one to three carbon atoms and $R^3$, $R^4$, $R^9$, and $R^{10}$ are hydrogen, or $R^1+R^3$, $R^2+R^4$, $R^7+R^9$, and $R^8+R^{10}$ are the same and equal to —$(CH_2)_3$—; or $R^1$ and $R^2$ are the same and equal to alkyl from one to three carbon atoms and $R^3$ and $R^4$ are hydrogen, or $R^1+R^3$ and $R^2+R^4$ are —$(CH_2)_3$—, $R^5$ is —$OR^6$, where $R^6$ is alkyl of one to four carbon atoms.

The most preferred p-aminophenyl carbonyl compounds are: Michler's ketone ($R^1=R^2=R^7=R^8=$methyl; $R^3=R^4=R^9=R^{10}=$hydrogen), ethyl Michler's ketone ($R^1=R^2=R^7=R^8=$ethyl; $R^3=R^4=R^9=R^{10}=$hydrogen), bis-(9-julolidyl)ketone ($R^1+R^3=R^2+R^4=R^7+R^8=R^8+R^{10}=$—$(CH_2)_3$—), methyl p-dimethyaminobenzoate ($R^1=R^2=$methyl; $R^3=R^4=$hydrogen; $R^6=$methyl) and ethyl p-dimethyaminobenzoate ($R^1=R^2=$methyl; $R^3=R^4=$hydrogen; $R^6=$ethyl).

Borate anions useful as coinitiators with dyes are disclosed in Gottschalk et al., U.S. Pat. Nos. 4,772,530 and 4,772,541 and Koike et al., Federal Republic of Germany patent application 3,822,921, the disclosures of which are incorporated by reference. The borate anions are represented by the following general formula:

$$BX_1X_2X_3X_4^-$$

where $X_1$, $X_2$, $X_3$, and $X_4$, are independently selected from the group consisting of alkyl, aryl, aralkyl, alkenyl, alkynyl, heterocyclic, and allyl groups, with the proviso that at least one of $X_1$, $X_2$, $X_3$, and $X_4$ is not aryl.

Each group may contain up to twenty carbon atoms, but groups with about seven carbon atoms or less are preferred. The alkyl groups may be linear, branched or cyclic, and may be substituted or unsubstituted. Representative alkyl groups which may be present are: methyl, ethyl, n-propyl and n-butyl. Representative cyclic alkyl groups include cyclobutyl, cyclopentyl, and cyclohexyl. Representative examples of aryl groups include phenyl and naphthyl, which may be unsubstituted or substituted with groups such as, for example, methyl and methoxy. Representative alkenyl groups are propenyl and ethynyl.

Preferably, at least one, but not more than three, of $X_1$, $X_2$, $X_3$, and $X_4$ is an alkyl group. More preferred are anions in which $X^1$-$X^4$ is a combination of three aryl groups and one alkyl group. The phenyl and p-methoxyphenyl groups are preferred aryl groups. A preferred anion is triphenylbutyl borate.

It is preferred that the cation associated with the borate anion not absorb a significant amount of actinic radiation since this would decrease photospeed. Representative cations are alkali metal cations and quaternary ammonium cations.

Quaternary ammonium cations containing four alkyl groups are preferred. The alkyl groups may be linear, branched or cyclic, and may be substituted or unsubstituted. Representative quaternary ammonium cations are tetramethyl ammonium, tetraethyl ammonium, tetrabutylammonium, benzyl trimethyl ammonium, benzyl dimethyl tetradecylammonium, and (2-hydroxyethyl)-trimethylammonium.

Cations with larger alkyl groups may be used to advantage since the solubility of the borate salt in the coating solvent is generally increased. Cations in which the alkyl groups together contain up to a total about thirty carbon atoms are preferred. Hydroxyl substitution may improve solubility and/or photospeed. Particularly preferred cations are (2-hydroxyethyl)trimethylammonium and benzyl dimethyl tetradecylammonium.

Photoinitiator systems containing 2,2′, 4,4′, 5,5′-hexaarylbisimidazoles, or HABIs, are well known. These compounds, which are described in: Chambers, U.S. Pat. No. 3,479,185; Cescon, U.S. Pat. No. 3,784,557; Dessauer, U.S. Pat. No. 4,252,887 and U.S. Pat. No. 4,311,783; Tanaka et al., U.S. Pat. No. 4,459,349, Wada et al., U.S. Pat. No. 4,410,621, and Sheets, U.S. Pat. No. 4,662,286, the disclosures of which are incorporated by reference, can be represented by the following general formula, in which Ar represents an aryl group.

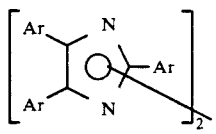

A preferred class of hexaarylbisimidazoles are 2-o-chlorophenyl-substituted derivatives in which the other positions on the phenyl radicals are either unsubstituted or substituted with chloro, methyl or methoxy groups. Preferred HABIs include: o-Cl-HABI, 2,2′-bis(o-chlorophenyl)-4,4,′5,5′-tetraphenyl-1,1′-biimidazole; CDM-HABI, 2-(o-chlorophenyl)-4,5-bis(m-methoxyphenyl)imidazole dimer; TCTM-HABI, 2,5-bis(o-chlorophenyl)-4-[3,4-dimethoxyphenyl]-lH-imidazole dimer; and TCDM-HABI, the product of the oxidative coupling of 2-(o-chlorophenyl)-4,5-diphenylimidazole and 2,4-bis-(o-chlorophenyl)-5-[3,4-dimethoxyphenyl]imidazole disclosed in Sheets, U.S. Pat. No. 4,662,286.

As disclosed in Chambers, U.S. Pat. No. 3,479,185, HABIs require a chain transfer agent or hydrogen donor to efficiently initiate photopolymerization. Without added chain transfer agent or hydrogen donor, little or no photopolymerization occurs. Thiols, such as 2-mercaptobenzthiazole or 2-mercaptobenzoxzole, are typically added to HABI containing initiator systems for this purpose. These compounds may oxidize to disulfides or react with other components of the composition during manufacture and storage of the photopolymer. Photospeed is lost.

It has been discovered that borate anions may be used as coinitiators for HABIs. When a borate anion is present, efficient photopolymerization is obtained, even in the absence of a chain transfer agent or hydrogen donor. Borate anions which may be used in combination with HABIs are described above.

HABIs absorb strongly in the 255-275 nm region of the spectrum and usually have somewhat lesser absorption in the 300-375 nm region. As described in Chang, U.S. Pat. No. 3,549,367, and Anderson et al., U.S. Pat. No. 4,535,052, sensitivity to the 300-375 nm region may be increased by using a hexaarylbisimidazole in combination with a p-aminophenyl carbonyl compound.

When a borate anion is added to a photoinitiator system containing a HABI and p-aminophenyl carbonyl compound, photospeed is increased. The p-aminophenyl carbonyl compounds described above may be used in combination with HABI and borate coinitiators. Addition of a chain transfer agent or hydrogen donor is unnecessary. The most preferred p-aminophenyl carbonyl compounds are Michler's ketone, ethyl Michler's ketone, bis-(9-julolidyl)ketone, methyl p-dimethyaminobenzoate and ethyl p-dimethyaminobenzoate.

Monomer

The composition contains at least one ethylenically unsaturated compound which undergoes free-radical initiated polymerization, generally known as a monomer. The composition contains at least one such material and may contain a mixture of such materials.

Typical monomers are: unsaturated esters of alcohols, preferably polyols, such as, diethylene glycol diacrylate, glycerol triacrylate, ethylene glycol dimethacrylate, pentaerythritol tri- andtetraacrylate and methacrylate; unsaturated amides, such 1,6-hexamethylene bisacrylamide; vinyl esters such as divinyl succinate, divinyl phthalate, and divinyl benzene-1,3-disulfonate; styrene and derivatives thereof; and N-vinyl compounds, such as N-vinyl carbazole. Numerous other unsaturated monomers polymerizable by free-radical initiated polymerization and useful in photopolymerizable compositions are known to those skilled in the art. For photoresist applications the preferred monomers are trimethylol propane triacrylate, the triacrylate ester of ethoxylated trimethylolpropane, tetraethylene glycol diacrylate, and tetraethylene glycol dimethacrylate

Binder

The composition contains at least one preformed macromolecular polymeric material, generally know as a binder. The composition contains at least one such material and may contain a mixture of such materials. In general, the binder should be soluble or swellable in the coating solvent and compatible with the other components of the photopolymerizable system.

Although the borate anion is generally unstable in the presence of strong acid, the use of acidic binders in the practice of this invention is not precluded. It is preferred, however, that the binder contain weakly acidic monomers, such as acrylic acid and methacrylic acid, and/or the binder have a low acid number.

Representative binders are poly(methyl methacrylate) and copolymers of methyl methacrylate with other alkyl acrylates, alkyl methacrylates, methacrylic acid, and/or acrylic acid; poly(vinyl acetate) and its partially hydrolyzed derivatives; gelatin; cellulose esters and ethers, such as cellulose acetate butyrate; and polyethylene oxides. Numerous other binders useful in photopolymerizable compositions are known to those skilled in the art. For photoresist applications the preferred binders are copolymers of methyl methacrylate, ethyl acrylate, and methacrylic acid. Copolymers of methyl methacrylate, ethyl acrylate, and methacrylic acid copolymerized with a small amount of allyl methacrylate may also be used to advantage.

Other Components

Other components conventionally added to photopolymerizable compositions can be present to modify the physical properties of the film. Such components include: plasticizers, thermal stabilizers, optical brighteners, ultraviolet radiation absorbing materials, adhesion modifiers, coating aids, and release agents.

A plasticizer may be present to modify adhesion, flexibility, hardness, and other mechanical properties of the film in a conventional fashion. When a binder is present, a plasticizer would be selected which is compatible with the binder as well as the monomer and other components of the composition. With acrylic binders, for example, plasticizers can include dibutyl phthalate and other esters of aromatic acids; esters of aliphatic polyacids, such as diisooctyl adipate; aromatic or aliphatic acid esters of glycols, polyoxyalkylene glycols, aliphatic polyols; alkyl and aryl phosphates; and chlorinated paraffins. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. Normally a conventional thermal polymerization inhibitor will be present to improve the storage stability the photopolymerizable composition. The nitroso dimers described in Pazos, U.S. Pat. No. 4,168,982, are also useful. Since monomers generally contain thermal polymerization inhibitors added by their manufacturers, it is frequently unnecessary to add additional inhibitor.

Nonionic surfactants may be added to the photopolymerizable composition as coating aids. Typical coating aids are polyethylene oxides, such as Polyox® WSRN, and fluorinated nonionic surfactants, such as Fluorad® FC-430 and Fluorad® FC-431.

Depending on the application, other inert additives can be employed such as dyes, pigments and fillers. These additives are generally present in minor amounts so as not to interfere with the exposure of the photopolymerizable layer.

Composition

While the composition of the photopolymerizable composition will depend on the intended application, when the composition is to be used as a dry film, in general, the binder should be at least about 25% and the monomer should not exceed about 60%, based on the total weight of the composition. If the amount of binder is below approximately 25%, or the amount of monomer exceeds approximately 60%, the composition has insufficient viscosity to form a solid film. While the amount of initiator system present will depend on the thickness of the layer and the desired optical density for the intended application, in general, about 0.1% to about 10% by weight will be present.

Typical compositions are by weight: binder(s) 25 to 90%, preferably 45 to 75%; monomer(s), 5 to 60%, preferably, 15 to 50%; plasticizer, 0 to 25%, preferably, 0 to 15%; photoinitiator system, 0.1 to 10%, preferably 1 to 7%; and other ingredients, 0 to 5%, typically 0 to 4%.

The amount of borate salt present is limited by its solubility. Although as much as 1% or more borate salt by weight may be added in favorable cases, addition of too much borate salt may adversely affect the dark stability and shelf life of the photopolymer. In general, the concentration of borate salt should be between about 0.05 and about 1%. A preferred range is about 0.1 to about 1.0%.

Substrates/Coating

The photopolymerizable compositions can be coated onto a wide variety of substrates. By "substrate" is meant any natural or synthetic support, preferably one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a plate which is a copper coating on fiberboard; in the preparation of lithographic printing plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, crosslinked polyester-coated paper, nylon, glass, cellulose acetate film, heavy paper such as lithographic paper, and the like.

The photopolymerizable layer may prepared by mixing the ingredients of the photopolymerizable composition in a solvent, such as dichloromethane, usually in the weight ratio of about 15:85 to 25↓ (solids to solvent), coating on the substrate, and evaporating the solvent. Coatings should be uniform. While the thickness of the layer will depend on the intended application, for dry film photoresists the coating should have a thickness of about 0.2 to 4 mil (5 to 100 microns), preferably 0.5 to 2 mil (13 to 50 microns), when dry. For protection, a release film, such as polyethylene or polypropylene, may be placed over the photopolymerizable layer after the solvent evaporates.

Alternatively, since photopolymer compositions are quickly and efficiently coated onto polymer fils using continuous web coating techniques, it may be convenient to coat the photopolymerizable composition onto a polymer film support, such as polyethylene terephthalate film, and laminate the resulting photopolymerizable layer to the substrate prior to exposuure. The photopolymerizable layer may be protected until it is ready for use by, preferably, a release film, such as polyethylene or polypropylene, applied as the coated polymer film emerges from the drier. After removal of the release film, the photopolymerizable layer can then be laminated to the support. The polymer film support then acts as a coversheet which is removed after exposure.

Exposure/Image Formation

Any convenient source or sources of actinic radiation providing wavelengths in the region of the spectrum that overlap the absorption bands of the sensitizer can be used to activate photopolymerization. By "actinic radiation" is meant radiation which is active to produce the free-radicals necessary to initiate polymerization of the monomer(s). The radiation can be natural or artificial, monochromatic or polychromatic, incoherent or coherent, and for high efficiency should correspond closely to in wavelength to the absorption of the initiator system.

Conventional light sources include fluorescent lamps, mercury, metal additive and arc lamps. Coherent light sources are xenon, argon ion, and ionized neon lasers, as well as tunable dye lasers and the frequency doubled neodymium: YAG laser, whose emissions fall within or overlap the visible absorption bands of the sensitizer.

The photopolymerizable compositions of this invention have good photospeed. They are useful in printing plates for offset and letter press, engineering drafting film, holographic recording films, photoresists, solder masks, and various proofing applications, such as prepress color proofing. Other specific uses will be evident to those skilled in the art.

In photoresist applications, resists prepared from the compositions of this invention are useful for the preparation of microcircuits. The resist can be either solvent soluble or aqueous developable. Solder masks are protective coatings which are selectively applied to portions of a printed circuit board to confine solder to pad areas on the board and to prevent bridging between conductors during tinning operations and during soldering of components. A solder mask also functions to prevent or minimize corrosion of the base copper conductors and as a dielectric to insulate certain components in adjacent circuitry.

The advantageous properties of this invention can be observed by reference to the following examples which illustrate, but do not limit, the invention.

EXAMPLES

Glossary

BDTB: Benzyl dimethyl tetradecylammonium triphenylbutyl borate

BPTMAB: (3-Bromopropyl)trimethyl ammonium triphenylbutyl borate

BTMAB: Benzyltrimethyl ammonium triphenylbutyl borate

BZ: Benzophenone; CAS 119-61-9

Carboset®1034: Poly(methyl methacrylate/ethyl acrylate/methacrylic acid) (44/35/21); MW 50,000; $T_g$ 87° C.; Union Carbide, Danbury, Conn.

o-Cl-HABI: 1,1'-Biimidazole, 2,2'-bis[o-chlorophenyl]-4,4',5,5'-tetraphenyl-; CAS 1707-68-2

CDM-HABI: 2-(o-chlorophenyl)-4,5-bis(m-methoxyphenyl)imidazole dimer; CAS 29777-36-4

EMK: Ethyl Michler's ketone; 4,4'-Bis-(diethylamino)-benzophenone; CAS 90-93-7

EPD: Quantacure® EPD; Ethyl p-dimethyaminobenzoate;

HTMAP: (2-Hydroxyethyl)trimethylammonium tetraphenylbutyl borate

Quantacure® ITX; 2-iso-Propylthioxanthone;

TBAB: Tetrabutylammonium triphenylbutyl borate

TCDM-HABI: Product of the oxidative coupling of 2-(o-chlorophenyl)-4,5-diphenylimidazole and 2,4-bis-(o-chlorophenyl)-5-[3,4-dimethoxyphenyl-]imidazole TCTM-HABI: 2,5-bis(o-chlorophenyl)-4-[3,4-dimethoxyphenyl]-1H-imidazole dimer;

TMAOAc: Tetrabutylammonium acetate

TMAB: Tetramethylammonium triphenylbutyl borate

TMABr: Tetramethylammonium bromide

TMACl: Tetramethylammonium chloride

TMAPF6 : Tetramethylammonium hexafluorophosphate

TMABF4 : Tetramethylammonium tetrafluoroborate

TEAB: Tetraethylammonium triphenylbutyl borate

TMPEOTA: Triacrylate ester of ethoxylated trimethylolpropane; CAS 28961-43-5

TMPTA: Trimethylolpropane triacrylate; 2-ethyl-2-(hydroxymethyl)-1,3-propanediol triacrylate; CAS 15625-89-5

General Procedures

In the Examples which follow it should be understood that "coating solution" refers to the mixture of solvent and additives which is coated, even though some of the additives may be in suspension rather than in solution, and that "total solids" refers to the total amount of nonvolatile material in the coating solution even though some of the additives may be nonvolatile liquids at ambient temperature. All parts are by weight unless otherwise indicated.

All operations were carried out under yellow lights. A stock solution containing Carboset ® 1034 (65.0%), TMPEOTA (26.0%), and TMPTA (9.0%) was prepared by dissolving the ingredients in 2-butanone (54.5% total solids). The indicated initiators were added to aliquots of the stock solution prior to coating. The indicated percentage of added initiator is the weight added initiator in gm relative to 100 gm of solids in the stock solution.

Solutions were board coated on 23 micron thick clear polyethylene terephthalate film with a 200 micron doctor blade to give a dry film thickness of approximately 38 microns. The coating solvent was 2-butanone. In some cases about 5% of 1-propanol or 2-propanol was added to increase the solubility of the ingredients in the coating solution.

Films were hot roll laminated to copper, exposed under a Stouffer-41 target (Stouffer Industries, South Bend, Ind.) using a PC-130 printer (Du Pont, Wilmington, Del.). The polyethylene terephthalate was left in place as a coversheet during exposure. The Stouffer-41 target contains forty one sixth root of two steps. The polyethylene terephthalate film was removed and the exposed samples developed at 50% breakpoint (29° C., 1% aqueous sodium carbonate) using a Chemcut aqueous processor (Chemcut, State College, Pa.).

All exposed films which were capable of holding steps were also capable of imaging at least an about 250 micron line and space pattern. Those exposed films which were incapable of holding steps were also incapable of holding the line and space pattern.

Control Example A

This example illustrates that tetramethyl ammonium chloride (TMACl), tetramethyl ammonium bromide (TMABr), tetramethyl ammonium acetate (TMAOAc), and tetramethyl ammonium hexafluorophosphate (TMAPF6) are not coinitiators for hexaarylbisimidazoles.

Samples containing the indicated initiators were prepared and exposed as described in the general procedures. An initiator system containing 0.20% EMK and 2.00% o-Cl HABI was added to each sample. The results are shown in Table 1.

TABLE 1

| Added Salt[a] | Exposure (mJ/cm$^2$) | $(2)^{1/6}$ Steps Held | Relative Photospeed |
|---|---|---|---|
| None | 94 | 26 | 1[b] |
| 0.04% TMACl | 94 | 26 | 1.0 |
| 0.06% TMABr | 94 | 27 | 1.1 |
| 0.18% TMABr | 94 | 26 | 1.0 |
| 0.05% TMAOAc | 94 | 26 | 1.0 |

TABLE 1-continued

| Added Salt[a] | Exposure (mJ/cm$^2$) | (2)$^{1/6}$ Steps Held | Relative Photospeed |
|---|---|---|---|
| 0.06% TMAPF6 | 94 | 26 | 1.0 |

[a]Initiator system: 0.20% EMK and 2.00% o-Cl HABI.
[b]Reference.

EXAMPLE 1

This example illustrates that tetramethyl ammonium triphenyl butyl borate (TMAB) is a coinitiator for hexaarylbisimidiazoles.

Samples containing (1) 2.00% the indicated HABI and (2) 2.00% the indicated HABI plus 0.12% TMAB were prepared and exposed as described in the general procedures. The results are shown in Table 2.

TABLE 2

| Initiator System | Exposure (mJ/cm$^2$) | (2)$^{1/6}$ Steps Held | Increase |
|---|---|---|---|
| 2.00% o-Cl-HABI | 1620 | 6 | |
| 2.00% o-Cl-HABI + 0.12% TMAB | 110 | 26 | 150 × |
| 2.00% CDM-HABI | 161 | 21 | |
| 2.00% CDM-HABI + 0.12% TMAB | 34 | 22 | 5.3 × |
| 2.00% TCTM-HABI | 797 | 15 | |
| 2.00% TCTM-HABI + 0.12% TMAB | 17 | 22 | 105 × |
| 2.00% TCDM-HABI | 17 | 14 | |
| 2.00 TCDM-HABI + 0.12% TMAB | 17 | 21 | 2.2 × |

EXAMPLE 2 AND CONTROL EXAMPLE B

This example illustrates that the triphenyl butyl borate anion is a coinitiator for hexaarylbisimidazole initiated photopolymerization but that tetramethyl ammonium tetrafluoroborate (TMABF4) is not.

Samples containing 0.20% EMK and 2.00% o-Cl HABI were prepared and exposed as described in the general procedures. The results are given in Table 3.

TABLE 3

| Added Salt[a] | Exposure (mJ/cm$^2$) | (2)$^{1/6}$ Steps Held | Relative Photospeed |
|---|---|---|---|
| None | 110 | 25 | 1[b] |
| 0.12% TMAB | 110 | 29 | 1.6 |
| 0.05% TMABF4 | 110 | 24 | 0.9[c] |
| 0.12% TMABF4 | 110 | 14 | 0.9[c] |

[a]Initiator system: 0.20% EMK and 2.00% o-Cl HABI.
[b]Reference.
[c]Decrease in photospeed.

EXAMPLE 3

This example illustrates that cations other than the tetramethyl ammonium cation may be used with the borate anion. A large increase in photospeed was observed with (2hydroxyethyl)trimethylammonium triphenylmethyl borate (HTMAP).

Samples containing 0.20% EMK and 2.00% o-Cl HABI were prepared and exposed as described in the general procedures. The results are shown in Table 4.

TABLE 4

| Added Salt[a] | Exposure (mJ/cm$^2$) | (2)$^{1/6}$ Steps Held | Relative Photospeed |
|---|---|---|---|
| None | 68 | 18 | 1[b] |
| 0.13% HTMAP | 68 | 29 | 3.6 |
| 0.65% HTMAP | 28 | 37 | 22.4 |
| 0.20% BDTB | 68 | 25 | 2.2 |

TABLE 4-continued

| Added Salt[a] | Exposure (mJ/cm$^2$) | (2)$^{1/6}$ Steps Held | Relative Photospeed |
|---|---|---|---|
| 0.50% BDTB | 68 | 28 | 3.2 |
| 1.00% BDTB | 68 | 31 | 4.5 |

[a]Initiator system: 0.20% EMK and 2.00% o-Cl HABI.
[b]Reference.

EXAMPLE 4

This example illustrates that borate salts with various cations may be used as coinitiators for an initiator system containing an amine and a hexaarylbisimidazole.

Samples containing the indicated initiators were prepared and exposed as described in the general procedures. The results are given in Table 5.

TABLE 5

| Added Salt[a] | Exposure (mJ/cm$^2$) | (2)$^{1/6}$ Steps Held | Relative Photospeed |
|---|---|---|---|
| None[a] | 120 | 24 | 1[b] |
| 0.12% TMAB | 120 | 30 | 2.0 |
| 0.24% TMAB | 120 | 33 | 2.8 |
| 0.14% TEAB | 120 | 28 | 1.6 |
| 0.17% TBAB | 120 | 31 | 2.2 |
| 0.20% BDTAB | 120 | 32 | 2.5 |
| 0.13% BTMAB | 120 | 33 | 2.8 |
| 0.15% BPTMAB | 120 | 31 | 2.2 |
| 0.18% TTP | 120 | 29 | 1.8 |
| 0.16% BTAB | 120 | 29 | 1.8 |

[a]Initiator system: 0.20% EMK and 2.00% o-Cl HABI.
[b]Reference.

EXAMPLE 5

This example illustrates that TMAB is a coinitiator for various initiators of photopolymerization.

Samples containing the indicated initiators were prepared and exposed as described in the general procedures. The results are shown in Table 6.

TABLE 6

| Initiator System | Exposure (mJ/cm$^2$) | (2)$^{1/6}$ Steps Held No Borate | (2)$^{1/6}$ Steps Held Borate[a] | Relative Photospeed |
|---|---|---|---|---|
| None | 1620 | 0 | 0 | c |
| 0.20% EMK | 815 | 18 | 39 | 9.0 |
| 2.00% BZ | 408 | 14 | 21 | 2.2 |
| 0.20% ITX | 408 | 20 | 34 | 5.0 |
| 2.00% EPD | 1620 | 0 | 8 | d |

[a]0.12% TMAB added.
[b]Photospeed of composition with borate added relative to the same composition without borate.
[c]Control - no photopolymerization with or without added borate.
[d]Not calculable. Greater than 2.5.

EXAMPLE 6

This example illustrates that tetramethyl ammonium triphenyl butyl borate (TMAB) is a coinitiator for an initiator system containing benzophenone (BZ) and a bis-[p-(N,N-dialkylamino)phenyl]ketone.

Samples containing (1) 2.00% BZ and 0.20% EMK and (2) 2.00% BZ and 0.20% EMK plus 0.12% TMAB were prepared and exposed as described in the general procedures. The results are shown in Table 7. Addition of borate to the initiator system increased photospeed about 60%.

TABLE 7

| Initiator system Initiator System | Exposure (mJ/cm$^2$) | (2)$^{1/6}$ Steps Held |
|---|---|---|
| 2.00% BZ + 0.20% EMK | 70 | 25 |

TABLE 7-continued

| Initiator system Initiator System | Exposure (mJ/cm²) | $(2)^{1/6}$ Steps Held |
|---|---|---|
| 2.00% BZ + 0.20% EMK + 0.12% TMAB | 44 | 25 |

What is claimed is:

1. A photopolymerizable composition with improved sensitivity to actinic radiation comprising:
   (A) an ethylenically unsaturated monomer capable of free-radical initiated polymerization; and
   (B) an initiator system activatible by actinic radiation, said initiator system consisting essentially of:
     (1) at least one compound selected from the group consisting of
       (a) hexaarylbisimidazoles and
       (b) p-aminophenyl carbonyl compounds of the following structure:

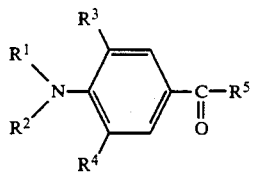

where:
   $R^1$ and $R^2$ are each independently hydrogen or alkyl from one to six carbon atoms and $R^3$ and $R^4$ are hydrogen, or $R^1+R^3$ is $-(CH_2)_2-$, or $-(CH_2)_3-$ and $R^2+R^4$ is $-(CH_2)_3-$;
   $R^5$ is hydrogen, alkyl of one to six carbon atoms, unsubstituted or substituted phenyl, or $-OR^6$, where $R^6$ is alkyl of one to six carbon atoms or unsubstituted or substituted phenyl;
   (2) a borate salt containing (a) a quaternary ammonium cation, said cation containing four alkyl groups, said alkyl groups together containing up to a total of thirty carbon atoms, and said cation bearing hydroxyl substitution, and (b) a borate anion represented by the formula:

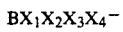

wherein $X_1$, $X_2$, $X_3$, and $X_4$, the same or different, are selected from the group consisting of alkyl, aryl, aralkyl, alkenyl, alkynyl, alicyclic, heterocyclic, and allyl groups, with the proviso that at least one of $X_1$, $X_2$, $X_3$, and $X_4$ is not aryl.

2. A photopolymerizable composition of claim 1 wherein the p-aminophenyl carbonyl compound is selected from the group consisting of Michler's ketone, ethyl Michler's ketone, bis-(9-julolidyl)ketone, methyl p-dimethyaminobenzoate and ethyl p-dimethyaminobenzoate.

3. A photopolymerizable composition of claim 1 wherein at least one hexaarylbisimidazole and at least one p-aminophenyl carbonyl compound are present.

4. A photopolymerizable composition of claim 1 wherein said cation is (2-hydroxyethyl)trimethylammonium.

5. A photopolymerizable composition of claim 1 additional comprising a binder.

6. A photopolymerizable composition of claim 5 wherein said compound is a p-aminophenyl carbonyl compound.

7. A photopolymerizable composition of claim 6 wherein $R^1$ and $R^2$ are each independently alkyl from one to three carbon atoms and $R^3$ and $R^4$ are hydrogen, or $R^1+R^3$ and $R^2+R^4$ are independently $-(CH_2)_3-$; $R^5$ is (1) hydrogen, (2) alkyl from one to four carbon atoms, (3) $-OR^6$, where $R^6$ is alkyl of one to four carbon atoms or unsubstituted or substituted phenyl, or (4):

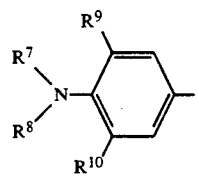

where
   $R^7$ and $R^8$ are each independently alkyl from one to three carbon atoms and $R^9$ and $R^{10}$ are hydrogen, or $R^7+R^9$ and $R^8+R^{10}$ are independently be $-(CH_2)_3-$.

8. A photopolymerizable composition of claim 7 wherein $R^1$, $R^2$, $R^7$, and $R^8$ are the same and equal to alkyl from one to three carbon atoms and $R^3$, $R^4$, $R^9$, and $R^{10}$ are hydrogen, or $R^1+R^3$, $R^2+R^4$, $R^7+R^9$, and $R^8+R^{10}$ are the same and equal to $-(CH_2)_3-$; or $R^1$ and $R^2$ are the same and equal to alkyl from one to three carbon atoms and $R^3$ and $R^4$ are hydrogen, or $R^1+R^3$ and $R^2+R^4$ are $-(CH_2)_3-$, $R^5$ is $-OR^6$, where $R^6$ is alkyl of one to four carbon atoms.

9. A photopolymerizable composition of claim 8 wherein the p-aminophenyl carbonyl compound is selected from the group consisting of Michler's ketone, ethyl Michler's ketone, bis-(9-julolidyl)ketone, methyl p-dimethyaminobenzoate and ethyl p-dimethyaminobenzoate.

10. A photopolymerizable composition of claim 5 wherein at least one hexaarylbisimidazole and at least one p-aminophenyl carbonyl compound are present.

11. A photopolymerizable composition of claim 5 wherein said cation is (2-hydroxyethyl)trimethylammonium.

12. A photopolymerizable composition of claim 5 wherein said photopolymerizable composition is a photoresist.

13. A photopolymerizable composition with improved sensitivity to actinic radiation comprising:
   (A) an ethylenically unsaturated monomer capable of free-radical initiated polymerization; and
   (B) an initiator system activatible by actinic radiation, said initiator system consisting essentially of:
     (1) at least one compound selected from the group consisting of
       p-aminophenyl carbonyl compound of the following structure:

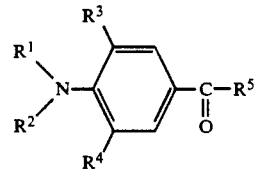

where:
R$^1$ and R$^2$ are each independently hydrogen or alkyl from one to six carbon atoms and R$^3$ and R$^4$ are hydrogen, or R$^1$+R$^3$ is —(CH$_2$)$_2$—, or —(CH$_2$)$_3$— and R$^2$+R$^4$ is —(CH$_2$)$_3$—;
R$^5$ is hydrogen, alkyl of one to six carbon atoms, unsubstituted or substituted phenyl, or —OR$^6$, where R$^6$ is alkyl of one to six carbon atoms or unsubstituted or substituted phenyl;

(2) a hydrogen abstracting ketone; and
(3) a borate salt containing (a) a quaternary ammonium cation, said cation containing four alkyl groups, said alkyl groups together containing up to a total of thirty carbon atoms, and said cation bearing hydroxyl substitution, and (b) a borate anion represented by the formula:

$$BX_1X_2X_3X_4^-$$

wherein X$_1$, X$_2$, X$_3$, and X$_4$, the same or different, are selected from the group consisting of alkyl, aryl, aralkyl, alkenyl, alkynyl, alicyclic, heterocyclic, and allyl groups, with the proviso that at least one of X$_1$, X$_2$, X$_3$, and X$_4$ is not aryl.

14. A photopolymerizable composition of claim 5 wherein said compound is a hexaarylbisimidazole.

15. The composition of claim 13 wherein said hydrogen abstracting ketone is benzophenone.

16. The composition of claim 13 wherein said composition additionally comprises a binder.

17. A photopolymerizable composition of claim 16 wherein said cation is (2-hydroxyethyl)trimethylammonium.

18. A photopolymerizable composition with improved sensitivity to actinic radiation comprising:
(A) an ethyleni8cally unsaturated monomer capable of free-radical initiated polymerication; and
(B) an initiator system activatible by actinic radiation, said initiator system consisting essentially of:
(1) a hexaarylbisimidazole; and
(2) a borate salt containing a cation which is an alkali metal cation or a quaternary ammonium cation and a borate anion represented by the formula:

$$BX_1X_2X_3X_4^-$$

wherein X$_1$, X$_2$, X$_3$, and X$_4$, the same or different, are selected from the group consisting of alkyl, aryl, aralkyl, alkenyl, alkynyl, alicyclic, heterocyclic, and allyl groups, with the proviso that at least one of X$_1$, X$_2$, X$_3$, and X$_4$ is not aryl.

19. A photopolymerizable composition of claim 18 additionally comprising a binder.

20. A photopolymerizable composition of claim 19 wherein said hexaarylbisimidazole is 2-o-chlorophenyl-substituted and the other positions on the phenyl radicals are either unsubstituted or substituted with chloro, methyl or methoxy groups.

21. A photopolymerizable composition of claim 19 wherein said hexaarylbisimidazole is selected from the group consisting of 2,2'-bis(o-chlorophenyl)-4,4', 5,5'-tetraphenyl-1,1'-biimidazole; 2-(o-chlorophenyl)-4,5-bis(m-methoxyphenyl)imidazole dimer; 2,5-bis(o-chlorophenyl)-4-1H-imidazole dimer; and the product of the oxidative coupling of 2-(o-chloro-phenyl)-4,5-diphenylimidazole and 2,4-bis-(o-chloro-phenyl)-5-imidazole.

22. A photopolymerizable composition of claim 19 wherein said cation is a quaternary ammonium cation containing four alkyl groups, said alkyl groups together containing up to a total of thirty carbon atoms.

23. A photopolymerizable composition of claim 22 wherein said cation bears hydroxyl substitution.

24. A photopolymerizable composition of claim 23 wherein said cation is (2-hydroxyethyl)trimethylammonium.

25. A photopolymerizable composition with improved sensitivity to actinic radiation comprising:
(A) an ethylenically unsaturated monomer capable of free-radical initiated polymerization; and
(B) an initiator system activatible by actinic radiation, said initiator system consisting essentially of:
(1) at least one compound selected from the group consisting of
(a) hexaarylbisimidazoles and
(b) p-aminophenyl carbonyl compounds of the following structure:

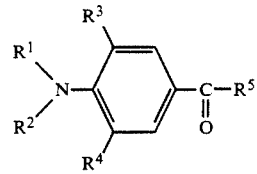

where:
R$^1$ and R$^2$ are each independently hydrogen or alkyl from one to six carbon atoms and R$^3$ and R$^4$ are hydrogen, or R$^1$+R$^3$ is —(CH$_2$)$_2$—, or —(CH$_2$)$_3$— and R$^2$+R$^4$ is —(CH$_2$)$_3$—;
R$^5$ is —OR$^6$, where R$^6$ is alkyl of one to six carbon atoms or unsubstituted or substituted phenyl;

(2) a borate salt containing a cation which is an alkali metal cation or a quaternary ammonium cation and a borate anion represented by the formula:

$$BX_1X_2X_3X_4^{31}$$

wherein X$_1$, X$_2$, X$_3$, and X$_4$, the same or different, are selected from the group consisting of alkyl, aryl, aralkyl, alkenyl, alkynyl, alicyclic, heterocyclic, and allyl groups, with the proviso that at least one of X$_1$, X$_2$, X$_3$, and X$_4$ is not aryl.

26. A photopolymerizable composition of claim 25 additionally comprising a binder.

27. A photopolymerizable composition of claim 26 wherein said cation is a quaternary ammonium cation containing four alkyl groups, said alkyl groups together containing up to a total of thirty carbon atoms.

28. A photopolymerizable composition of claim 27 wherein said cation bears hydroxyl substitution.

29. A photopolymerizable composition of claim 28 wherein said cation is (2-hydroxyethyl)trimethylammonium.

30. A photopolymerizable composition of claim 26 swherein said hexaarylbisimidazole is 2-o-chlorophenyl-substituted and the other positions on the phenyl radicals are either unsubstituted or substituted with chloro, methyl or methoxy groups.

* * * * *